United States Patent [19]

Koshimaru

[11] Patent Number: 4,823,179
[45] Date of Patent: Apr. 18, 1989

[54] SEMICONDUCTOR MEMORY DEVICE WITH FLIP-FLOP MEMORY CELLS WHICH INCLUDE POLYCRYSTALLINE LOAD RESISTORS

[75] Inventor: Shigeru Koshimaru, Tokyo, Japan
[73] Assignee: NEC Corporation, Tokyo, Japan
[21] Appl. No.: 821,305
[22] Filed: Jan. 22, 1986
[30] Foreign Application Priority Data Jan. 22, 1985 [JP] Japan .................................. 60-9435

[51] Int. Cl.[4] ........................ H01L 27/02; H01L 29/04
[52] U.S. Cl. ........................................ 357/41; 357/51; 357/59
[58] Field of Search .......................... 357/59 F, 41, 51

[56] References Cited

U.S. PATENT DOCUMENTS

| 4,234,889 | 11/1980 | Raymond et al. | 357/59 F |
|---|---|---|---|
| 4,240,097 | 12/1980 | Raymond | 357/59 F |
| 4,322,824 | 3/1982 | Allan | 357/59 F |
| 4,370,798 | 2/1983 | Lien et al. | 357/59 F |
| 4,453,175 | 6/1984 | Ariizumi et al. | 357/59 F |
| 4,558,343 | 12/1985 | Ariizumi et al. | 357/41 |

Primary Examiner—Gene M. Munson
Attorney, Agent, or Firm—Sughrue, Mion, Zinn, Macpeak & Seas

[57] ABSTRACT

A semiconductor memory includes a number of static memory cells formed in a substrate. Each memory cell comprises a flip-flop circuit including a pair of first and second insulated gate field effect transistors formed in the substrate. Each of the transistors has a gate connected to one end of the source-drain path of the other transistor of the transistor pair. A pair of first and second load resistors are connected to the above one ends of the first and second transistors, respectively. Each of the load resistors is constituted of a polycrystalline semiconductor layer formed with the intermediary of an insulative layer on the gate of the transistor whose source-drain path is connected is series to the other load resistor. A pair of transfer gate transistors are formed in the substrate and respectively connected to the above one ends of the first and second transistors for selective drive of the flip-flop circuit.

6 Claims, 6 Drawing Sheets

SEMICONDUCTOR MEMORY DEVICE WITH FLIP-FLOP MEMORY CELLS WHICH INCLUDE POLYCRYSTALLINE LOAD RESISTORS

BACKGROUND OF THE INVENTION

1 Field of the Invention

The present invention relates to a semiconductor device, and more particularly to a static semiconductor memory which has an improved information retaining characteristics and can operate at a decreased standby current.

2 Description of the Invention

Heretofore, different types of semiconductor devices, which can store binary information or data in terms of electric charges, have been developed and are at present used in various memories such as static memories, dynamic memories, read only memories (ROMs), etc. The reason for this is that a semiconductor memory having high integration density and large storage capacity can be easily obtained because each memory cell can be formed with a very small area. Among these semiconductor memories, the static semiconductor memory has been widely used as an random access memory (RAM), because it can retain stored data indefinitely without periodical refresh operation.

This static random access memory (SRAM) can be implemented by a large number of flip-flop circuits each of which stores one bit of information. Ordinarily, each flip-flop is composed of a pair of enhancement mode insulated gate field effect transistors having a gate connected to one end of a source-drain path of the other transistor. The selected end of each transistor is connected through a load element to a power supply line and is also connected through a transfer gate to a read/write line.

When the flip-flop is put in one condition, one of the transistors is held on and the other transistor is held off. Therefore, an electric current I continuously flows from the power supply line through the transistor held in the ON condition and the load element connected in series thereto. This current I will determine a so-called "standby current" $I_{SB}$ of the static memory.

As will be seen from the above, this current I is inevitable to each memory cell of the static memory. Accordingly, with increase in density of cells for a larger storage capacity, the standby current is unavoidably increased. Therefore, it is strongly desired to reduce the current I flowing through each memory cell.

On the other hand, this current I is determined by the resistance of the load element and the conductive resistance of the transistor. At present, the load element is, in some case, formed by a resistor composed of a polycrystalline silicon, and this load resistor can have a resistance extremely larger than the conductive resistance of the transistor. Therefore, the current I is determined by the resistance of the polycrystalline silicon resistor.

However, the resistance of the polycrystalline silicon resistor has already approached to its limit, and so, it is very difficult to further decrease the current I. In addition, decrease of the current I will weaken the compensating ability for maintaining the condition of the flip-flop without being subjected to influence of a leak current generated from the high level node. In other words, if the current I is decreased, the information retaining ability is reduced.

SUMMARY OF THE INVENTION

Accordingly, it is an object of the present invention to provide a semiconductor device, which resolves the above mentioned disadvantages of the conventional semiconductor memory.

Another object of the present invention is to provide a static semiconductor memory in which a flip-flop have a polycrystalline silicon load resistor of a resistance higher than that of the conventional one, so that the static memory can have a decreased standby current even at a high integration density.

Still another object of the present invention is to provide a static semiconductor memory which has an improved information retaining characteristics and a decreased standby current.

A further object of the present invention is to provide a static semiconductor memory operable at a low consumption of power, while ensuring a stable information retaining ability.

A still further object of the present invention is to provide such a static semiconductor memory which can be manufactured without substantial change to the conventional manufacturing method.

The above and other objects of the present invention are achieved in accordance with the present invention by a semiconductor device comprising a substrate; a field effect transistor formed in the substrate and having a gate electrode formed on the substrate; and a resistor constituted of polycrystalline semiconductor layer formed through the intermediary of an insulative layer on the gate electrode of the field effect transistor.

With the semiconductor device as mentioned above, when a current is caused to flow along the polycrystalline semiconductor layer, the electric line of force in the polycrystalline semiconductor layer is influenced by the voltage applied to the gate of the field effect transistor underlying the polycrystalline semiconductor layer. Specifically, the larger the difference between the gate voltage of the field effect transistor and the voltage applied to one end of the polycrystalline semiconductor resistor is, the larger the effective resistance of the polycrystalline semiconductor resistor becomes. Therefore, by biasing the gate so as to increase the above mentioned voltage difference, the polycrystalline semiconductor resistor can have a effective resistance sufficiently higher than that of a conventional polycrystalline semiconductor resistor.

Furthermore, according to the present invention there is provided a semiconductor memory including a number of static memory cells formed in a substrate. Each memory cell comprises a flip-flop circuit including a pair of first and second insulated gate field effect transistors formed in the substrate. Each of the transistors has a gate connected to one end of the source-drain path of the other transistor of the transistor pair. A pair of first and second load resistors are connected to the above one ends of the first and second transistors, respectively. Each of the load resistors is constituted of a polycrystalline semiconductor layer formed with the intermediary of an insulative layer on the gate of the transistor whose source-drain path is connected in series to the other load resistor. A pair of gate means are formed in the substrate and respectively connected to the above one ends of the first and second transistors for selective drive of the flip-flop circuit.

In each memory cell of the above mentioned memory, when the first transistor in the flip-flop is turned on, the second transistor in the flip-flop is turned off. In this condition, a current flows through the source-drain path of the first transistor and the first load resistor connected in series thereto, but does not flow through the source-drain path of the second transistor and the second load resistor connected in series thereto.

Therefore, the first node between the first load resistor and the source-drain path of the first transistor, i.e., the gate of the second transistor is at a low level, and so, the difference in voltage between the gate of the second transistor and the first load resistor formed thereon is large. Accordingly, the first polycrystalline semiconductor resistor has a large effective resistance, so that the current flowing through the first resistor and the first transistor is maintained at a small level. Therefore, the standby current will be decreased.

On the other hand, the second node between the second resistor and the source-drain path of the second transistor, i.e., the gate of the first transistor is at a high level, and therefore, the voltage difference between the gate of the first transistor and the second load resistor formed thereon is small. Accordingly, the second polycrystalline semiconductor resistor is held at an effective resistance lower than that of the first resistor, and so, the gate of the first transistor is surely maintained at a high level even if a leak current occurs at the second node between the second load resistor and the source-drain path of the second transistor. Thus, the condition of the flip-flop is stably retained.

The above and other objects, features and advantages of the present invention will be apparent from the following description of preferred embodiments of the invention with reference to the accompanying drawings.

DESCRIPTION OF THE PREFERRED EMBODIMENTS

Figure 1:
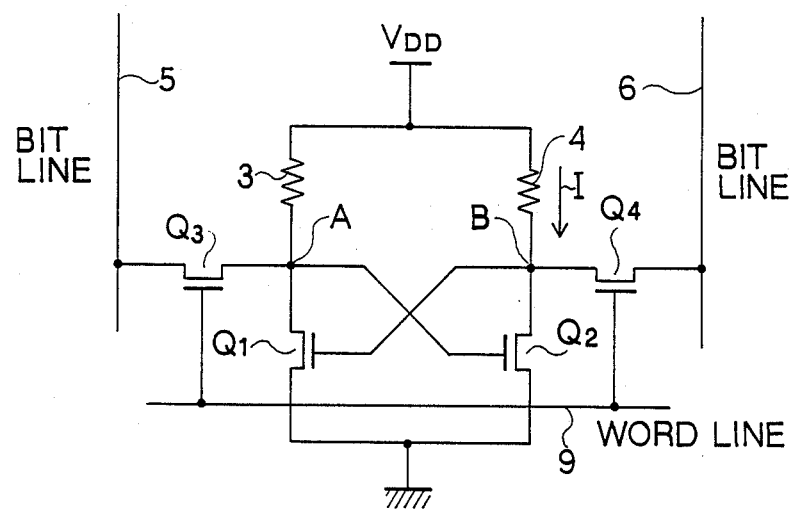
FIG. 1 is a circuit diagram showing the construction of one typical SRAM cell.

Referring now to FIG. 1, there is shown a circuit diagram of one cell of a typical static random access memory composed of insulated gate field effect transistors (abbreviated "FET" hereinafter) connected in the form of a flip-flop. The shown memory cell comprises a pair of source-grounded FETs $Q_1$ and $Q_2$ having their gates connected through nodes B and A to the drain of the other FET. The drains of the two FETs $Q_1$ and $Q_2$ are connected to a $V_{DD}$ line through load resistors 3 and 4, respectively, and also connected to a pair of bit lines 5 and 6 through another pair of FETs $Q_3$ and $Q_4$, respectively whose gates are connected to a word line 9 to constitute transfer gate respectively.

In the static memory cell as mentioned above, writing of information is performed as follows: A pair of signals are applied to the pair of bit lines 5 and 6, and the word line 9 is brought to a predetermined level so that the transfer gates $Q_3$ and $Q_4$ are turned on. Thus, the node A, i.e., the gate of the FET $Q_2$ and the node B, i.e., the gate of FET $Q_1$ are respectively charged in accordance with the potential difference between the signals applied to the bit lines 5 and 6. For example, if the bit line 5 is brought to a high level and the bit line 6 is brought to a low level or ground potential, the node A is put at the high level so as to turn on the FET $Q_2$, and at the same time, the node B is put at the low level or ground potential so that the FET $Q_1$ is completely rendered into an OFF condition. Thus, the information is written, and this electrical condition in which the node A and B are at the high and low levels, respectively, is retained after the transfer gates $Q_3$ and $Q_4$ are turned off. This is a information retaining condition.

However, in this condition, an electric current I continuously flows from the $V_{DD}$ line through the load resistor 4 and the FET $Q_2$ to the ground. This current I will determine the aforementioned "standby current" $I_{SB}$ of the static memory.

This current I is inevitable to each memory cell of the static memory. Accordingly, if the static memory is increased in density of cells to have a larger storage capacity, the standby current is unavoidably increased. Therefore, it is strongly desired to decrease this standby current $I_{SB}$. For the purpose, it is required to reduce the current I flowing through each memory cell.

As will be understood from FIG. 1, this current I is determined by the resistances of the load resistor 4 (or 3) and the conductive resistance of the FET $Q_2$ (or $Q_1$). At present, the load resistor is, in some case, formed by a polycrystalline silicon layer, because the polycrystalline silicon load resistor can have a resistance extremely larger than the conductive resistance of the FET. Therefore, the current I is substantially determined by the resistance of the polycrystalline silicon resistor.

Figure 2:
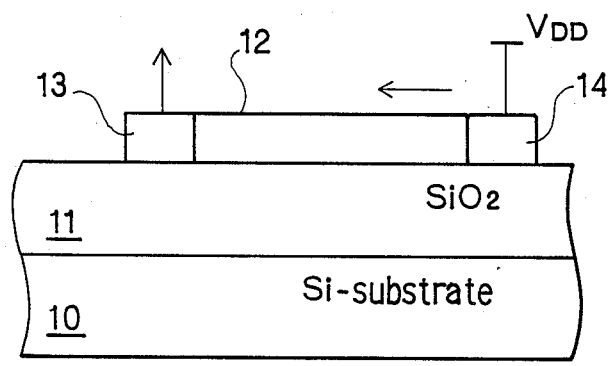
FIG. 2 is a diagrammatic sectional view showing a conventional polycrystalline silicon resistor.

This polycrystalline silicon resistor has heretofore been formed as shown in FIG. 2, for example. In the shown structure, a semiconductor substrate 10 has a thick $SiO_2$ layer 11 formed thereon, and a polycrystalline silicon layer formed on the $SiO_2$ layer 11 to have a high resistance central portion 12 and a low resistance portions 13 and 14 formed in opposite ends of the high resistance portion 12. The high resistance portion 12 constitutes the load resistor 3 or 4, and the low resistance portions 13 and 14 constitute electrodes for connection.

As mentioned hereinbefore, however, the resistance of the polycrystalline silicon resistor has already approached to its limit, and so, it is very difficult to further decrease the current I. In addition, decrease of the current I will weaken the compensating power for maintaining the condition of the flip-flop without being subjected to influence of a leak current generated from the high level node, as will be seen from FIG. 1. In other words, if the current I is too decreased, the information retaining power is reduced.

Figure 3:
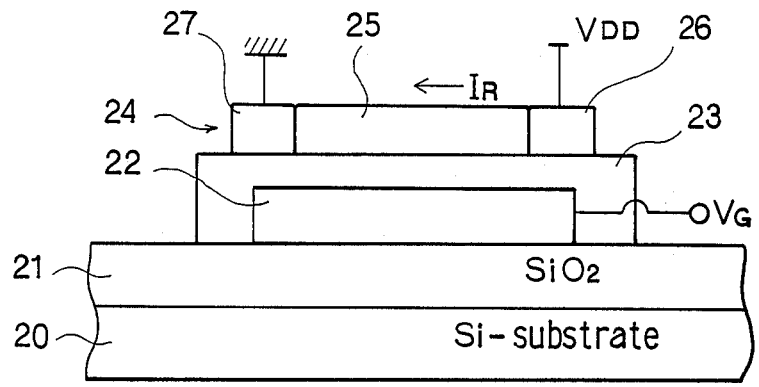
FIG. 3 is a diagrammatic sectional view showing the polycrystalline silicon resistor constructed in accordance with the present invention.

Turning to FIG. 3, there is shown a sectional view of a resistor constructed in accordance with the present invention. A silicon substrate 20 has a SiO$_2$ layer 21 of 1.0 μm thickness formed thereon for example by a thermal oxidation. A highly phosphorus-doped polycrystalline silicon electrode 22 is deposited on the SiO$_2$ layer 21, and is coated with an oxide layer 23 having a thickness of 2000Å, which can be formed by a chemical vapor deposition (CVD). Further, a polycrystalline silicon layer 24 is deposited on the oxide layer 23. This polycrystalline silicon layer 24 are composed of a high resistance central portion 25 having almost no impurity, and a pair of low resistance electrodes 26 and 27 formed at opposite ends of the central portion 25. Therefore, the high resistance portion 25 forms a resistor.

Such a polycrystalline silicon resistor can be formed for example by depositing a polycrystalline silicon layer 24 on the oxide layer 23 by CVD process, also depositing a nitride layer on the layer 24 by CVD process, forming on the nitride layer a resist pattern which covers above a possible high resistance portion 25, etching the nitride layer in accordance with the resist pattern, and implanting phosphorus ions using the remaining nitride layer as a mask, so that the electrode portions 26 and 27 are highly doped with phosphorus, while the resistor portion 25 is almost not doped with phosphorus.

In the resistor constructed as mentioned above, the electrode 27 is connected to ground, and the electrode 26 is connected to the $V_{DD}$ supply line. Further, the electrode 22 is connected to a $V_G$ bias voltage source. In this condition, a current $I_R$ flows from the electrode 26 to the electrode 27. However, this current $I_R$ is not determined by only the voltage $V_{DD}$ across the resistor 25, and is influenced by the bias potential $V_G$ of the electrode 22.

Figure 4:
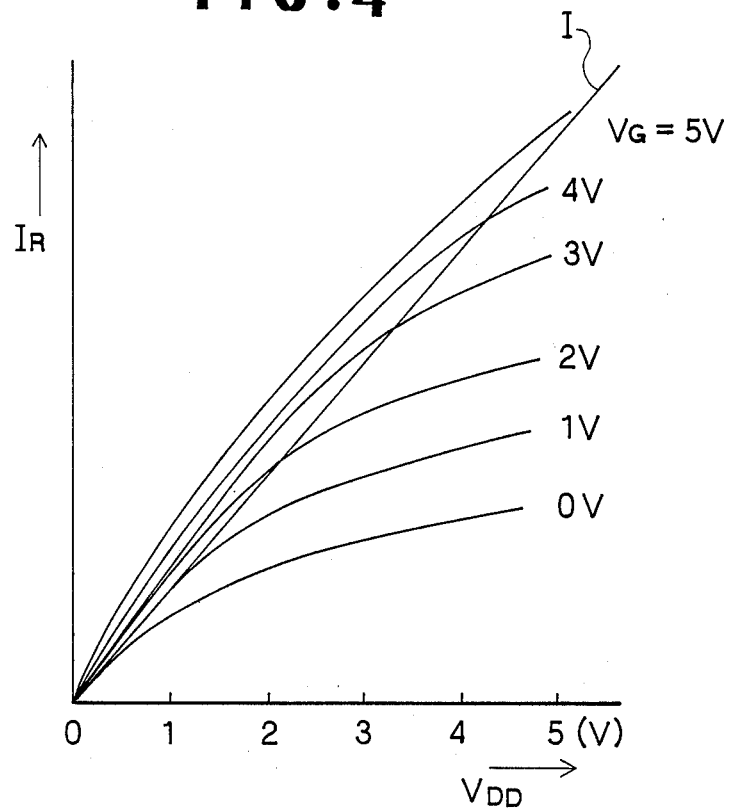
FIG. 4 is a graph showing the relation between the current $I_R$ flowing through the resistor, the voltage $V_{DD}$ applied to the resistor and the voltage $V_G$ applied to the underlying gate, in the case of the polycrystalline silicon resistor shown in FIG. 3.

Referring to FIG. 4, there is shown a graph indicating the relation between the factors $I_R$, $V_{DD}$ and $V_G$. Specifically, the graph of FIG. 4 shows the relation between the current $I_R$ and the voltage $V_{DD}$ at the bias voltage $V_G = 0, 1, 2, 3, 4$ and 5V. In addition, a straight line I shows the relation between the current and the voltage in the conventional polycrystalline silicon resistor.

As seen from FIG. 4, the current $I_R$ is greatly dependent upon the bias voltage $V_G$. Specifically, when the bias voltage $V_G$ is decreased in comparison to the resistor voltage $V_{DD}$, the current $I_R$ is decreased as compared with the conventional polycrystalline silicon resistor. Examining the current under the condition of $V_{DD} = 5V$, the current $I_R$ at $V_G = 0V$ is about one half or one third of the current at $V_G = 5V$.

On the other hand, with $V_G > C_{DD}$, the current $I_R$ is slightly larger than the current I of the conventional resistor. This is because electrons are induced at the surface of the polycrystalline silicon resistor 25 by the bias voltage $V_G$.

Figure 5:
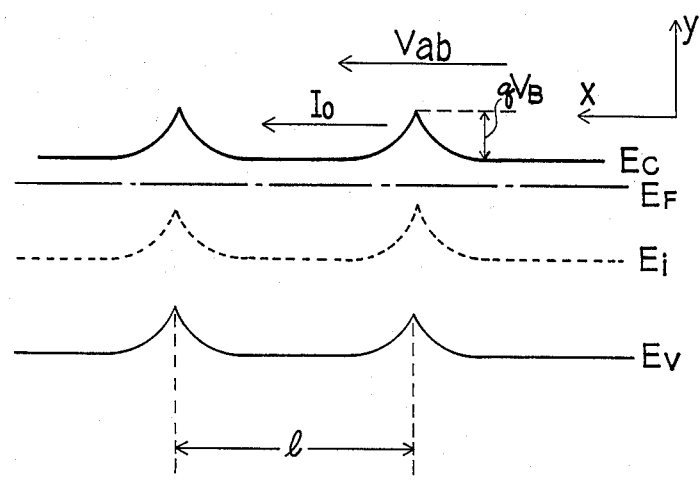
FIG. 5 is an energy band structure diagram illustrating the current mode in a high resistance polycrystalline silicon resistor.

Turning to FIG. 5, there is shown an energy band structure diagram in a high resistance polycrystalline silicon for illustration of a current model. In FIG. 5, l is the grain size in the polycrystalline silicon; $V_B$ is the height of the barrier at the grain boundary; and $V_{ab}$ is the voltage applied to one grain. In addition, $E_C$ represents the energy level of the conduction band; $E_F$ is the Fermi level; $E_i$ is the Fermi level of intrinsic semiconductor; $E_V$ is the energy level of the valence band.

In the model shown in FIG. 5, the current $I_O$ flowing through the polycrystalline silicon is expressed as follows:

$$I_0 \propto \exp\left(\frac{E_F - qV_B}{kT}\right) V_{ab}$$

where
k is Boltzmann's constant
T is absolute temperature

Figure 6:
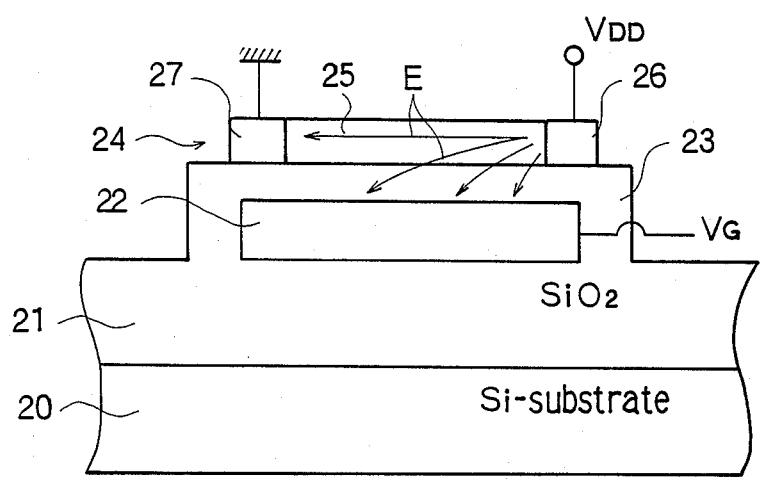
FIG. 6 is a view similar to FIG. 3 but illustrating the distribution of electric field.

On the other hand, with $V_G < V_{DD}$, the electric line of force E extending from $V_{DD}$ to ground is curved as shown in FIG. 6. As a result, the two components of the grain voltage $V_{ab}$ are decreased, and so, the current $I_R$ flowing through the polycrystalline resistor 25 above the electrode 22 is decreased.

As seen from the above, if a polycrystalline silicon load resistor is formed above a gate electrode of a field effect transistor which is maintained at a low potential, the current through the load resistor can be limited to a small value which cannot be obtained in the conventional polycrystalline silicon resistor.

Figure 7A:
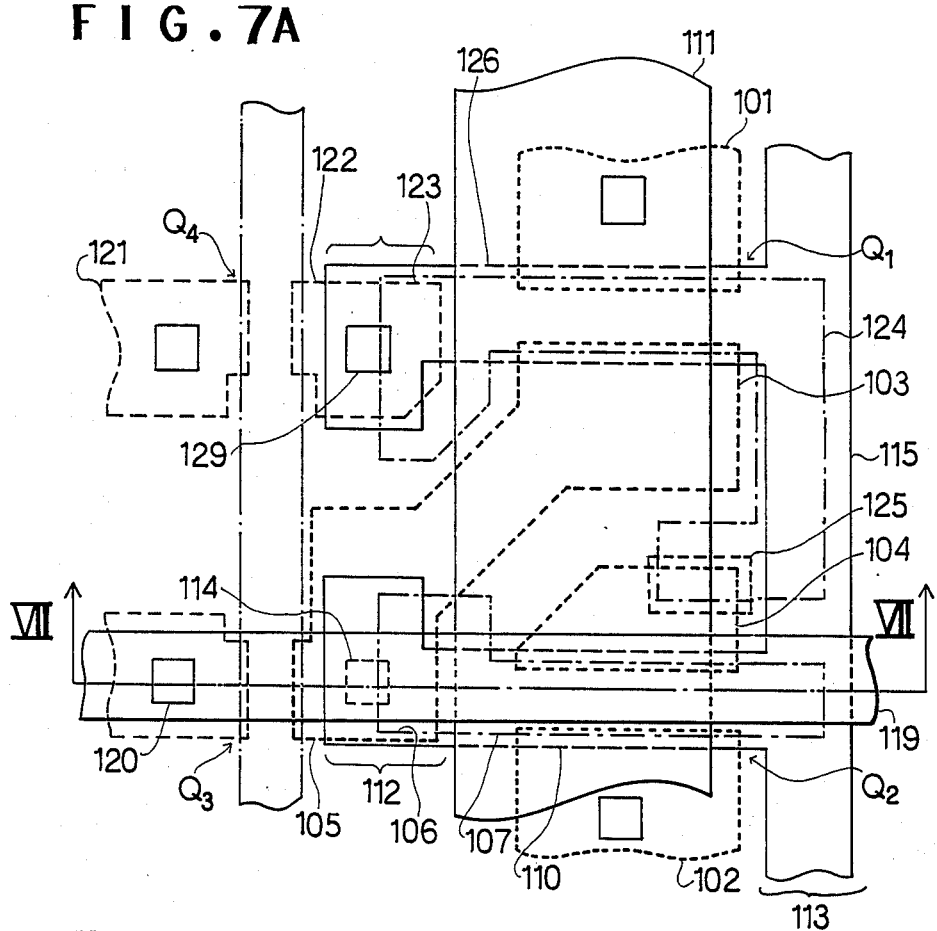
FIG. 7A is a layout pattern diagram of one embodiment of the static memory in accordance with the present invention.
Figure 7B:
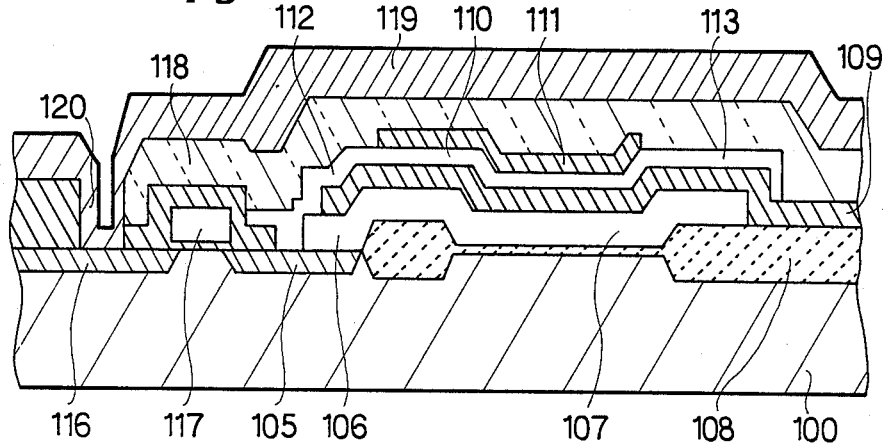
FIG. 7B is a sectional view taken along the line VII--VII in FIG. 7A.

Referring to FIGS. 7A and 7B, there are shown a layout pattern of one static memory cell embodying the present invention and a sectional view thereof.

As shown in FIGS. 7A and 7B, the memory cell comprises a p$^-$ silicon substrate 100, and a pair of N-channel FETs $Q_1$ and $Q_2$ formed at a principal surface of the substrate 100. The substrate 100 has a pair of N$^+$ diffused regions 101 and 102 which form source regions of the N-channel FETs $Q_1$ and $Q_2$, respectively. The substrate 100 also has another pair of N$^+$ diffused regions 103 and 104 which form drain regions of the N-channel FETs $Q_1$ and $Q_2$.

The drain region 103 of FET $Q_1$ is common to a diffused drain region 105 of a third FET $Q_3$ which is connected through a direct contact portion 106 to one end of a polycrystalline silicon gate electrode 107, which is in turn formed on an isolation oxide layer 108 extending between the source region 102 and the drain region 104 of the FET $Q_2$. On the polycrystalline silicon gate electrode 107, an interlayer insulating SiO$_2$ layer 109 is formed, and also another polycrystalline silicon layer 110 is deposited on the interlayer insulating layer 109. This layer 110 is selectively doped with impurity by using as a mask a Si$_3$N$_4$ layer 111 deposited on a region between the source 102 and the drain 104 of the FET $Q_2$, so that low resistance regions 112 and 113 are formed at opposite ends of the polycrystalline silicon layer 110 covered by the Si$_3$N$_4$ layer 111. One low resistance region 112 of the layer 110 is connected to the region 105 through a direct contact portion 114, and the other low resistance region 113 is integral with a wiring polycrystalline layer 115.

Adjacent to but separately from the diffused drain region 105, a diffused source region 116 is formed in the substrate 100, and a polycrystalline silicon gate 117 is deposited with the intermediary of an insulating layer on the substrate between the diffused regions 105 and 116. Further, another interlayer insulating layer 118 of phosphorus glass is coated on the surface of the substrate, and an aluminum electrode 119 is deposited on the phosphorus glass layer 118 and is connected to the diffused region 116 through a direct contact portion 120.

In addition, the substrate 100 has a pair of diffused regions 121 and 122 in parallel to and separate from the diffused region 105 and 116, and the gate electrode 117 extends between the two diffused regions 121 and 122. Namely, the diffused regions 121 and 122 and the gate 117 constitute a fourth FET $Q_4$. The diffused region 122 is connected through a direct contact portion 123 to one end of a polycrystalline silicon gate electrode 124, formed on the isolation oxide layer 108 extending between the source region 101 and the drain region 103 of the FET $Q_1$. The other end of this gate electrode 124 extend to the drain region 104 of the FET $Q_2$ and is connected to the drain 104 through a direct contact portion 125. On this gate electrode 124, the interlayer insulating $SiO_2$ layer 109 is formed, and a polycrystalline silicon layer 126 is deposited on the interlayer insulating layer 109. This layer 126 is selectively doped with impurity by masking with the $Si_3N_4$ layer 111, so that low resistance regions 127 and 128 are formed at opposite ends of the polycrystalline silicon layer 126 covered by the $Si_3N_4$ layer 111. One low resistance region 127 of the layer 126 is connected to the region 122 through a direct contact portion 129, and the other low resistance region 128 is integral with the wiring polycrystalline layer 115.

With the above mentioned memory cell, the high resistance polycrystalline silicon resistors are formed above the gate electrode of the FETs constituting a flip-flop. Therefore, the resistor above the low potential gate electrode has a large effective resistance, whereby the standby current is decreased. On the other hand, the resistor above the high potential gate electrode will have an effective resistance smaller than a equal to that of the polycrystalline silicon resistor of the conventional structure, as can be understood from FIG. 4. Therefore, the information retaining characteristics is improved.

Figure 8A:
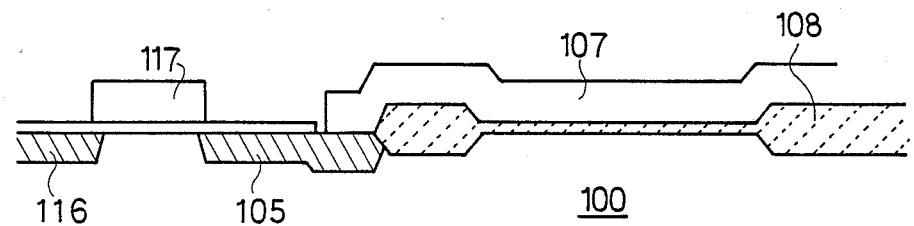
FIGS. 8A and 9A are sectional views illustrating various steps in the method of manufacturing the static memory shown in FIGS. 7A and 7B.
Figure 8B:
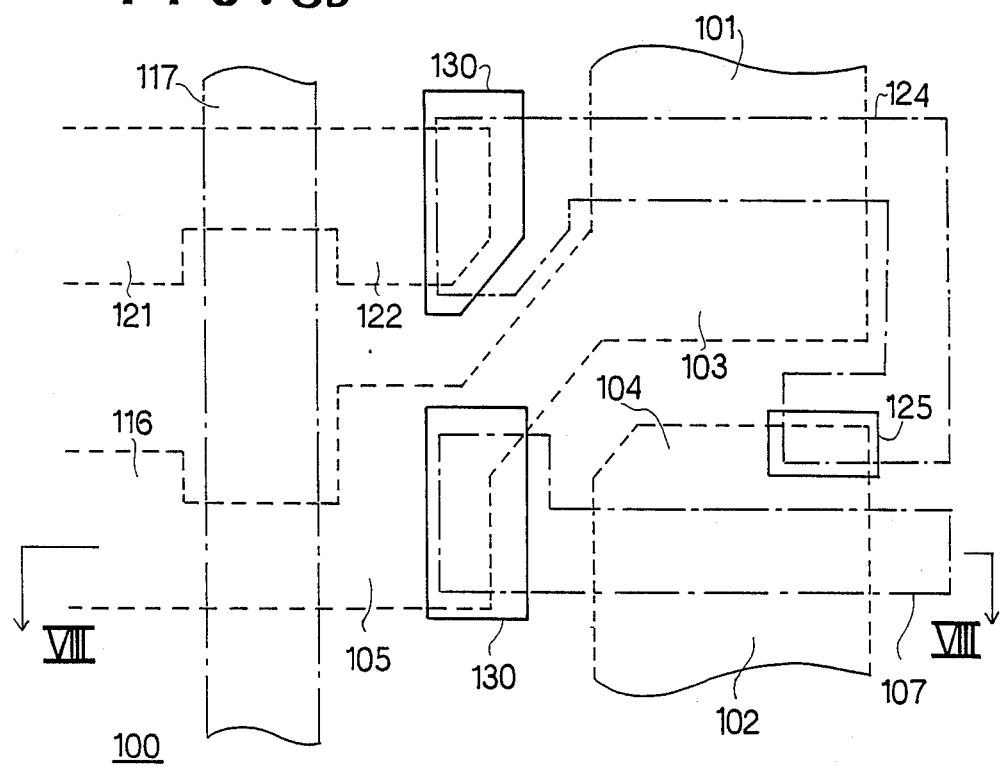
FIGS. 8B and 9B are layout pattern diagrams corresponding to the steps shown in FIGS. 8A and 9A.

The above mentioned memory cell can be manufactured as follows: As shown in FIGS. 8A and 8B, the field oxide layer 108 is formed on the substrate 100, and then, direct contact holes 125 and 130 are formed through the field oxide layer 108. Thereafter, a polycrystalline silicon layer is deposited on the substrate and phosphorus is selectively doped to the polycrystalline layer. A photo resist is deposited and exposed to form a predetermined mask. Through the photo resist mask the doped polycrystalline silicon layer is etched to form the electrodes 107, 117 and 124. Further, phosphorus ions are implanted by a gate self-alignment process so as to form source and drain regions 101, 102, 103, 104, 105, 116, 121 and 122.

Figure 9A:
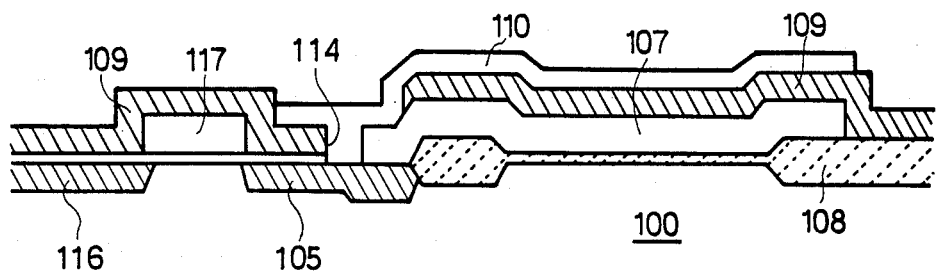
Figure 9B:
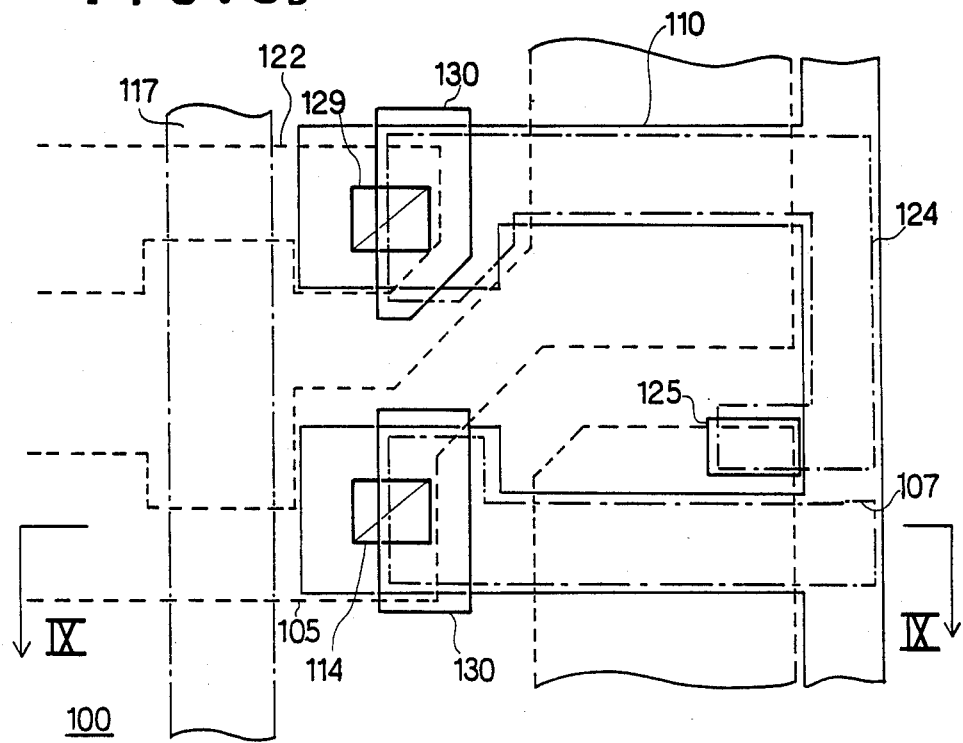

Thereafter, the interlayer insulating layer 109 is formed on the gate electrodes 107 and 124, for example, by the CVD process or the thermal oxidation process, as shown in FIG. 9A. This interlayer insulating layer 109 is preferred to be thin for enhancement of the advantage of the present invention. Specifically, the thickness of the layer 109 is not greater than 2000Å. Then, the contact holes 114 and 129 are formed, and the polycrystalline silicon layer 110 is deposited at a thickness of 2000Å to 4000Å. This polycrystalline silicon layer 110 is etched to form the resistors overlapping the gate electrodes 107 and 124 and directly contacting to the diffused regions 105 and 122 through the contact holes 114 and 129, as shown in FIGS. 9A and 9B.

Further, the $Si_3N_4$ layer 111 is formed by the CVD process on a portion of the polycrystalline silicon layer 110 which should form a high resistance region, and phosphorus ions are implanted using the $Si_3N_4$ layer 111 as a mask so as to form the low resistance electrodes 112 and 113 and the wiring pattern 115. Thereafter, as shown in FIGS. 7A and 7B, the second interlayer insulator layer 118 of the phosphorus glass is deposited by the CVD process, and the contact holes 116 are formed and the aluminum wiring 119 is formed.

As seen from the above, the memory cell shown in FIGS. 7A and 7B can be manufactured in the conventional method without additional steps and without substantial change of the processes excluding change of the mask pattern.

While the invention has been described in connection with the preferred embodiments, it is not intended to limit the scope of the invention to the particular form set forth, but, on the contrary, it is intended to cover such alternatives, modifications, and equivalents as may be included within the spirit and scope of the invention as defined by the appended claims.

I claim:

1. A semiconductor memory including a number of static memory cells formed in a substrate, each memory cell comprising a flip-flop circuit including a pair of first and second insulated gate field effect transistors formed in the substrate, each of the transistors having a gate connected to one end of the source-drain path of the other transistor of the transistor pair, and a pair of first and second load resistors connected to the above one ends of the first and second transistors, respectively, each of the load resistors being constituted of a polycrystalline semiconductor resistor including a high resistance portion of high resistivity and a low resistance portion of low resistivity electrically connected to opposite ends of the high resistance portion, the high resistance portion of high resistivity being formed through the intermediary of an insulative layer of a thickness of not greater than 2000 angstroms on the gate of the transistor whose source-drain path is connected in series to the other load resistor, whereby the effective resistance of each load polycrystalline semiconductor resistor is controlled by a potential of the gate electrode of the field effect transistor whose source-drain path is connected in series to the other load resistor, in such a manner that the resistance of the polycrystalline semiconductor resistor becomes a low resistance when the potential of the gate electrode is at a high level.

2. A semiconductor memory as claimed in claim 1 wherein each of the memory cells includes a pair of gate means formed in the substrate and respectively connected to the above one ends of the first and second transistor for selectively coupling the associated flip-flop circuit to a pair of read/write lines of the flip-flop circuit.

3. A semiconductor memory as claimed in claim 2 wherein the substrate is a silicon substrate and the first and second field effect transistors respectively have source and drain diffused regions formed in the substrate separately from each other, the gate electrode of each transistor being formed through an insulator layer on a substrate portion between the source and drain regions, and wherein the insulative layer between each gate electrode and the associated polycrystalline semiconductor layer is an interlayer insulating layer covering the gate electrode.

4. A semiconductor memory as claimed in claim 3 wherein each polycrystalline semiconductor resistor is a polycrystalline silicon layer having a high resistance non-doped portion and low resistance highly-doped portions formed at opposite ends of the non-doped portion.

5. A semiconductor memory as claimed in claim 4 wherein the gate means are third and fourth field effect transistors formed in the substrate, each of the third and fourth transistors having a gate connected to a word line and being connected at one end of its source-drain path to an associated bit line and at the other end of its source-drain path to the above one end of the associated one of the first and second transistors.

6. A semiconductor memory as claimed in claim 5 wherein each polycrystalline silicon load resistor is directly contacted at its one highly-doped low resistance end to one of source and drain regions of the associated transfer gate transistor.

* * * * *